US008669168B1

(12) United States Patent
Storm et al.

(10) Patent No.: US 8,669,168 B1
(45) Date of Patent: Mar. 11, 2014

(54) METHOD FOR REDUCING THE CONCENTRATION OF OXYGEN, CARBON, AND SILICON IMPURITIES ON NITROGEN-POLAR SURFACES OF GALLIUM NITRIDE

(71) Applicants: David F. Storm, Waldorf, MD (US); Douglas S. Katzer, Alexandria, VA (US); Glenn G. Jernigan, Waldorf, MD (US); Steven C. Binari, Annandale, VA (US)

(72) Inventors: David F. Storm, Waldorf, MD (US); Douglas S. Katzer, Alexandria, VA (US); Glenn G. Jernigan, Waldorf, MD (US); Steven C. Binari, Annandale, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/737,010

(22) Filed: Jan. 9, 2013

(51) Int. Cl.
*H01L 21/20* (2006.01)

(52) U.S. Cl.
USPC ............... 438/503; 438/507; 257/E21.09

(58) Field of Classification Search
USPC .................................................. 438/503, 507
See application file for complete search history.

(56) References Cited

PUBLICATIONS

D.F. Storm et al., "Homoepitaxial N-polar GaN layers and HEMT structures grown by rf-plasma assisted molecular beam epitaxy", Journal of Vacuum Science and Technology B, vol. 30, No. 2, Article 02B113-1 (2012).
Storm, et al., Journal of Crystal Growth 301-302, 429-433 [2007].
Storm et al., Journal of Crystal Growth 380, 14-17 [2013].
O. Brandt et al., "Critical issues for the growth of high-quality (Al, Ga)N/GaN and GaN/(In, Ga)N heterostructures on SiC(0001) by molecular-beam epitaxy", Applied Physics Letters vol. 75, No. 25, p. 4019 (1999).
M. Asif Khan et al., "Deposition and surface characterization of high quality single crystal GaN layers", Journal of Applied Physics vol. 73, p. 3108 (1993).
Y. Cao et al., "Polarization-engineered removal of buffer leakage for GaN transistors", Applied Physics Letters vol. 96.

*Primary Examiner* — Alexander Ghyka
(74) *Attorney, Agent, or Firm* — US Naval Research Laboratory; Roy Roberts

(57) ABSTRACT

A method of preparing GaN material includes subjecting a GaN substrate to at least two cycles of Ga deposition and desorption, then applying a layer of AlN to the GaN substrate, then growing GaN on the AlN layer by molecular beam epitaxy. This results in reduced concentrations of oxygen, carbon, and silicon impurities.

2 Claims, 2 Drawing Sheets

METHOD FOR REDUCING THE CONCENTRATION OF OXYGEN, CARBON, AND SILICON IMPURITIES ON NITROGEN-POLAR SURFACES OF GALLIUM NITRIDE

BACKGROUND

Gallium nitride based semiconductor materials are attractive for electronic and optoelectronic devices. Gallium nitride epitaxial layers and device structures grown on native GaN substrates contain several orders of magnitude fewer threading defects than similar structures grown heteroepitaxially on non-native substrates. However, GaN grown by molecular beam epitaxy on native substrates contains high concentrations (typically $>10^{19}$ cm$^{-3}$) of oxygen, carbon, and silicon.

N-polar GaN substrates are often utilized with little or no chemical cleaning prior to placement within the molecular beam epitaxy (MBE) reactor chamber. Homoepitaxial GaN layers grown on such untreated surfaces show evidence of high concentrations of unwanted impurities (i.e. oxygen, carbon, silicon). The existing best practice (see Reference 1) is to employ an ex situ chemical clean using solvents and hydrofluoric acid prior to loading the substrate wafer into the MBE reactor, and then to use several cycles of gallium deposition at low temperature (such as approximately 650° C.) followed by desorption at high temperature (such as approximately 815° C.). This procedure removes oxygen on the surface by converting it to volatile gallium oxide which then desorbs from the surface. This technique has been reported on both GaN (Reference 2) and SiC (Reference 3) substrates.

The reactive surfaces of GaN reduce the effectiveness of surface cleaning procedures performed ex situ (outside the vacuum growth chamber), thus an in situ procedure is desirable in order to reduce the concentrations of these impurities.

BRIEF SUMMARY

In one embodiment, a method of preparing GaN material includes subjecting a GaN substrate to at least two cycles of Ga deposition and desorption, then applying a layer of AlN to the GaN substrate, then growing GaN on the AlN layer by molecular beam epitaxy.

In another embodiment, a method of preparing GaN material includes cleaning a N-polar GaN substrate using solvents and hydrofluoric acid, then heating the N-polar GaN substrate to 700° C. under an ultra high vacuum, then subjecting the N-polar GaN substrate to at least three cycles of Ga deposition and desorption, then applying a layer of AlN to the N-polar GaN substrate, then growing GaN on the AlN layer by molecular beam epitaxy.

DETAILED DESCRIPTION

Definitions

Figure 1:
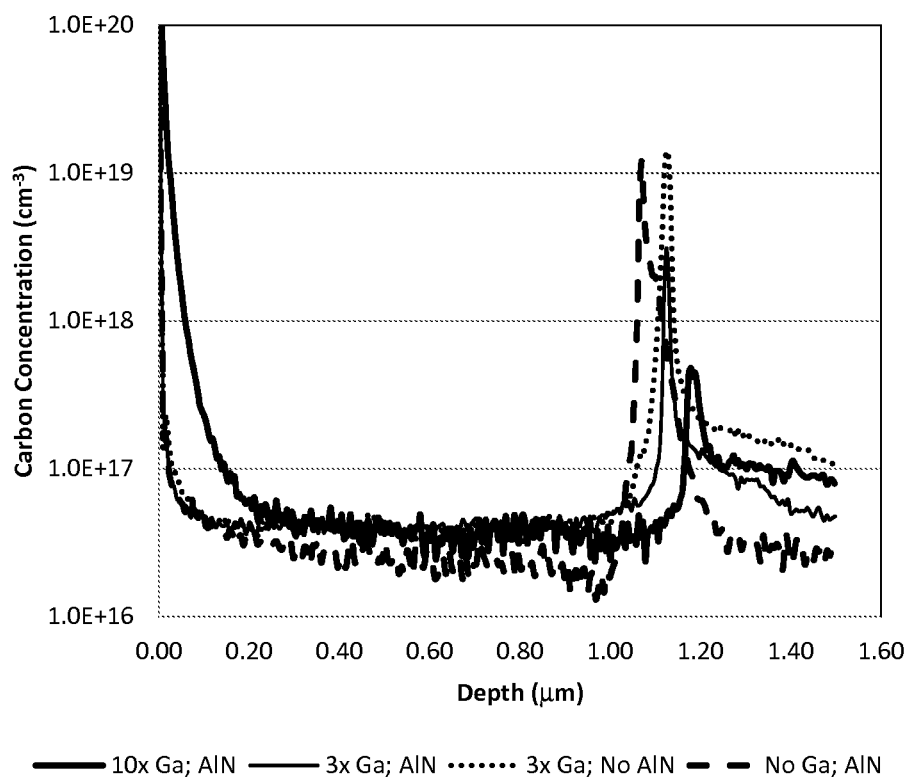
FIG. 1 shows carbon concentration versus depth as measured by secondary ion mass spectrometry (SIMS). The curves are from different samples with various numbers of Ga deposition and desorption cycles (10×, 3×, none) and with or without a 15-Å initial AlN layer.

Before describing the present invention in detail, it is to be understood that the terminology used in the specification is for the purpose of describing particular embodiments, and it is not necessarily intended to be limiting. Although many methods, structures and materials similar, modified, or equivalent to those described herein can be used in the practice of the present invention without undue experimentation, the preferred methods, structures and materials are described herein. In describing and claiming the present invention, the following terminology will be used in accordance with the definitions set out below.

As used in this specification and the appended claims, the singular forms "a", "an," and "the" do not preclude plural referents, unless the content clearly dictates otherwise.

As used herein, the term "and/or" includes any and all combinations of one or more of the associated listed items.

As used herein, the term "about" when used in conjunction with a stated numerical value or range denotes somewhat more or somewhat less than the stated value or range, to within a range of ±10% of that stated.

As used herein, the term "ultra-high vacuum" or "UHV" refers to a pressure of less than $10^{-9}$ torr.

DESCRIPTION

Using a combination of gallium deposition and desorption and growth of an ultrathin AlN layer significantly reduces the concentrations of oxygen, silicon, and carbon present at the interface between an N-polar GaN substrate surface and a molecular beam epitaxy (MBE)-grown GaN layer.

Gallium deposition and desorption has been effective at removing oxygen, but not to reduce carbon or silicon impurity concentrations. Previously, N-polar GaN was thought to be less robust against thermal decomposition than the Ga-polar surface, which decomposes at ~690° C. Thus, it was not clear that the use of gallium deposition and desorption (typically requiring temperatures up to 815° C.) would be possible without damaging the surface on an N-polar substrate.

Ultrathin layers of AlN have been used on Ga-polar GaN templates to reduce buffer leakage currents in MBE-grown GaN layers (Reference 4), but not recognized to have any effect on carbon or silicon impurity concentrations. While both techniques (Ga deposition and desorption, ultrathin AlN layers) are effective at removing oxygen or reducing buffer leakage currents, neither one is sufficient to reduce carbon or silicon impurity concentrations.

As an initial step in the technique described herein, it is preferable that the GaN substrate has undergone a chemical clean and outgas in ultrahigh vacuum (UHV) such as described in Reference 1.

An exemplary ex situ chemical cleaning proceeds as follows:
  5 minutes ultrasound bath in trichloroethane;
  5 minutes second ultrasound bath in trichloroethane;
  5 minutes ultrasound bath in acetone;
  5 minutes ultrasound bath in isopropanol;
  5 minutes ultrasound bath in deionized water;
  5 minutes soak in 1:1 mixture of 49% hydrofluoric acid and deionized water;
  5 minutes ultrasound bath in deionized water;
  Dry under flowing dry nitrogen;
  Load immediately in UHV MBE system.

It is desirable that the cleaned substrate be outgassed under UHV conditions. This can be accomplished by, for example, raising the substrate temperature from ambient/room temperature to 700° C. over 10 minutes; maintaining substrate temperature at 700° C. for 30 minutes; allow substrate to cool to room temperature/ambient; and then transferring substrate to deposition chamber. Preferably, the outgassing is done in a preparation chamber operably connected to a chamber suitable for MBE, so that the substrate can be transferred directly and cleanly from one to the other.

For gallium deposition and desorption, it is desirable to first raise the substrate temperature to approximately 650° C. over 8 minutes and then maintain this temperature for about 15 minutes. The temperature is optionally higher, but should be below 740° C. The surface should then be exposed to a flux of gallium atoms (Ga deposition), typically from an effusion cell and preferably equal to about $10^{14}$ cm$^{-2}$s$^{-1}$, for about 60 seconds. At the end of the exposure the temperature of the wafer should be raised to ~815° C., at which temperature the deposited gallium will re-evaporate (Ga desorption). The temperature should then be reduced to below 740° C. and the cycle of deposition and desorption repeated for a total of at least two cycles, and in embodiments up to nine times. In the MBE system, the brightness of the diffraction pattern on the phosphor screen from electrons diffracting off the substrate surface may be used to indicate the presence or absence of gallium metal on the surface (Reflection High Energy Electron Diffraction).

Next, and preferably immediately prior to homoepitaxial GaN growth, the substrate should be exposed to the nitrogen plasma for 60 s, after which a 15-Å thick AlN layer shall be grown on the N-polar wafer surface. Following this, it is desirable that the GaN layer growth commence without delay.

Results

Figure 2:
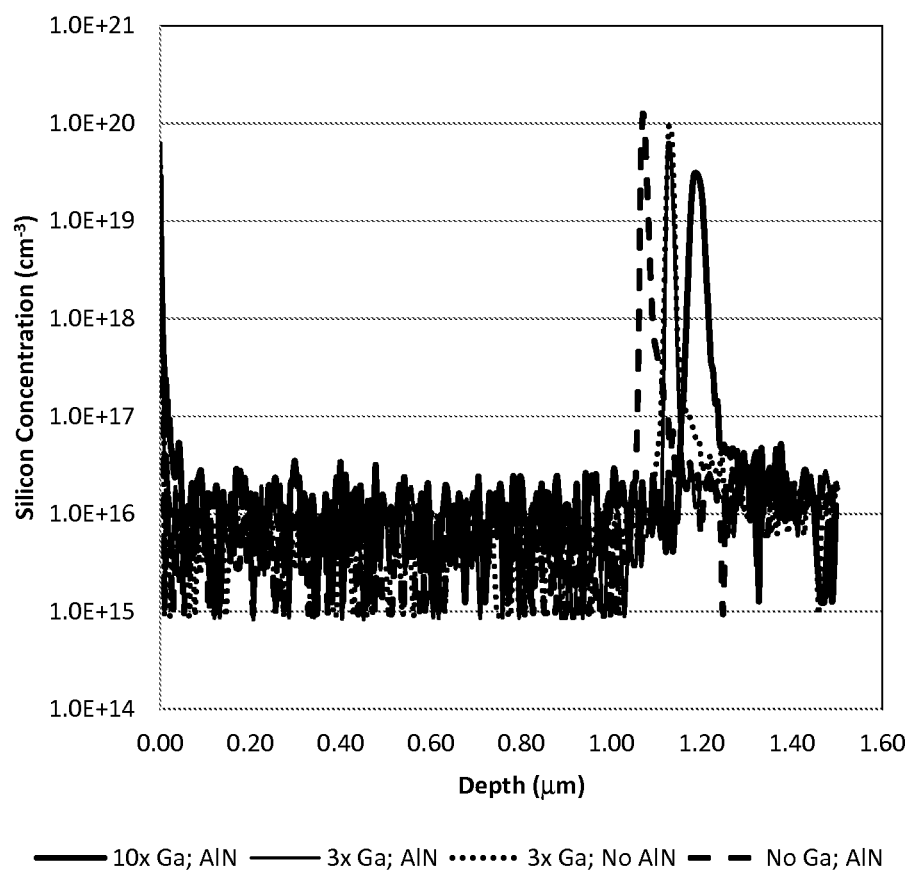
FIG. 2 shows silicon concentration versus depth as measured by SIMS.

By combining the repeated cycles of gallium deposition and desorption with an ultrathin AlN layer the concentration of oxygen, carbon, and silicon impurities were significantly reduced. FIGS. 1 and 2 depict the carbon and silicon impurity concentrations versus depth measured by secondary ion mass spectrometry (SIMS) in four samples that underwent four different growth initiation procedures. One sample had 10 cycles of Ga deposition and desorption and an AlN layer deposition ("10× Ga; AlN"). Another had three cycles of Ga deposition and desorption and AlN deposition ("3× Ga; AlN"). The final two had either the Ga deposition and desorption ("3× Ga; No AlN") or the AlN layer deposition ("No Ga, AlN") but not both. As can be seen from FIGS. 1 and 2, respectively, the peak C and Si concentrations near 1 μm are highest in the latter two curves. The peak concentrations are significantly lower when both Ga deposition and desorption and the ultrathin AlN growth are used. The reduction in the peak Si concentration is ~40% when both Ga desorption and ultrathin AlN growth are used, as shown in Table I, while the reduction of the peak C concentration is over 80% for three cycles of Ga deposition and desorption and well over 90% for ten Ga deposition and desorption cycles (plus AlN). Reductions in the oxygen concentration are similar to those of carbon but do not require the AlN layer. These clearly demonstrate the utility of using both Ga deposition and desorption and AlN layer deposition together.

TABLE I

Sample ID, number of gallium deposition and desorption cycles, presence (Y) or absence (N) of a 15-Å AlN interlayer; and sheet concentrations of carbon, silicon, and oxygen at the regrowth interface.

| Sample ID | Ga Cycles | AlN (Y/N) | $[C]_{sh,rif}$ ($10^{13}$ cm$^{-2}$) | $[Si]_{sh,rif}$ ($10^{13}$ cm$^{-2}$) | $[O]_{sh,rif}$ ($10^{13}$ cm$^{-2}$) |
|---|---|---|---|---|---|
| A | 0 | Y | 2.3 | 13.0 | 49.8 |
| B | 3 | N | 2.5 | 12.5 | 13.9 |
| C | 3 | Y | 0.42 | 8.1 | 8.15 |
| D | 10 | Y | 0.17 | 8.0 | 2.97 |

FIG. 1 shows carbon concentration versus depth as measured by SIMS. The curves are from different samples with various numbers of Ga deposition and desorption cycles (10×, 3×, none) and with or without an ultrathin 15-Å initial AlN layer. The regrowth interface is located near 1.1-1.2 microns. Significant reductions in carbon concentration at the regrowth interface can be seen for the two samples which had both Ga deposition and desorption pre-treatment as well as the AlN initial layer compared to the two samples which had only one or the other.

FIG. 2 shows silicon concentration versus depth as measured by SIMS. The curves are from different samples with various numbers of Ga deposition and desorption cycles (10×, 3×, none) and with or without an ultrathin 15-Å initial AlN layer. The regrowth interface is located near 1.1-1.2 microns. Reduced silicon concentration at the regrowth interface can be seen for the two samples which had both Ga deposition and desorption pre-treatment as well as the AlN initial layer compared to the two samples which had only one or the other.

It was additionally found that threading dislocations were not generated at the regrowth interface between the substrate and epitaxial layers despite the presence of the ultrathin AlN layer.

The described method results in significantly lower concentrations of impurities (oxygen, carbon, and silicon) in N-polar GaN grown by MBE on N-polar GaN substrate wafers. This is a method which can be implemented easily and without significantly altering existing nitride MBE systems or adversely affecting growth regimes.

The combination of Ga deposition and desorption cycles with the initial 15-Å AlN layer is surprisingly effective at significantly reducing the concentration of carbon impurity.

Concluding Remarks

All documents mentioned herein are hereby incorporated by reference for the purpose of disclosing and describing the particular materials and methodologies for which the document was cited.

Although the present invention has been described in connection with preferred embodiments thereof, it will be appreciated by those skilled in the art that additions, deletions, modifications, and substitutions not specifically described may be made without departing from the spirit and scope of the invention. Terminology used herein should not be construed as being "means-plus-function" language unless the term "means" is expressly used in association therewith.

REFERENCES

Each of the following documents is incorporated herein by reference in its entirety.
1. D. F. Storm et al., "Homoepitaxial N-polar GaN layers and HEMT structures grown by rf-plasma assisted molecular beam epitaxy", Journal of Vacuum Science and Technology B, Vol. 30, No. 2, Article 02B113-1 (2012).

2. M. Asif Khan et al., "Deposition and surface characterization of high quality single crystal GaN layers", Journal of Applied Physics Vol. 73, p. 3108 (1993).
3. O. Brandt et al., "Critical issues for the growth of high-quality (Al, Ga)N/GaN and GaN/(In, Ga)N heterostructures on SiC(0001) by molecular-beam epitaxy", Applied Physics Letters Vol. 75, No. 25, p. 4019 (1999)
4. Y. Cao et al., "Polarization-engineered removal of buffer leakage for GaN transistors", Applied Physics Letters Vol. 96, Art. 042102
5. D. F. Storm et al., "Oxygen incorporation in homoepitaxial N-polar GaN grown by radio frequency-plasma assisted molecular beam epitaxy: Mitigation and modeling", Journal of Applied Physics Vol. 112, Art. 013507 (2012).

What is claimed is:

1. A method of preparing GaN material, the method comprising:
    heating a N-polar GaN substrate to 700° C. under an ultra high vacuum, then
    subjecting the N-polar GaN substrate to at least two cycles of Ga deposition and desorption, then
    applying a layer of AlN to the N-polar GaN substrate, then growing GaN on the AlN layer by molecular beam epitaxy.

2. A method of preparing GaN material, the method comprising:
    cleaning a N-polar GaN substrate using solvents and hydrofluoric acid, then heating the N-polar GaN substrate to 700° C. under an ultra high vacuum, then
    subjecting the N-polar GaN substrate to at least three cycles of Ga deposition and desorption, then
    applying a layer of AlN to the N-polar GaN substrate, then growing GaN on the AlN layer by molecular beam epitaxy.

* * * * *